United States Patent
Shannon et al.

(10) Patent No.: US 8,092,605 B2
(45) Date of Patent: Jan. 10, 2012

(54) MAGNETIC CONFINEMENT OF A PLASMA

(75) Inventors: Steven C. Shannon, San Mateo, CA (US); Masao Drexel, Santa Cruz, CA (US); James A. Stinnett, Yorba Linda, CA (US); Ying Rui, Sunnyvale, CA (US); Ying Xiao, San Jose, CA (US); Roger A. Lindley, Santa Clara, CA (US); Imad Yousif, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 623 days.

(21) Appl. No.: 11/564,206

(22) Filed: Nov. 28, 2006

(65) Prior Publication Data

US 2008/0121345 A1     May 29, 2008

(51) Int. Cl.
    *C23C 16/00*     (2006.01)
    *H01L 21/306*     (2006.01)
    *C23F 1/00*     (2006.01)

(52) U.S. Cl. ............. 118/728; 118/723 FE; 118/723 FI; 118/723 MA; 118/623; 156/345.39; 156/345.42; 156/345.46

(58) Field of Classification Search ............. 156/345.39, 156/345.42, 345.46; 118/723 FE, 723 FI, 118/723 MA, 728, 623
See application file for complete search history.

(56) References Cited

U.S. PATENT DOCUMENTS

| 5,211,825 | A | 5/1993 | Saito et al. | |
|---|---|---|---|---|
| 6,126,790 | A | * 10/2000 | Moslehi et al. | 204/192.1 |
| 6,322,661 | B1 | 11/2001 | Bailey, III et al. | |
| 6,361,667 | B1 | 3/2002 | Kobayashi et al. | |
| 6,562,189 | B1 | 5/2003 | Quiles et al. | |
| 2001/0032590 | A1 | 10/2001 | Carducci et al. | |
| 2003/0037880 | A1* | 2/2003 | Carducci et al. | 156/345.43 |
| 2006/0081559 | A1 | 4/2006 | Miyata et al. | |

OTHER PUBLICATIONS

Choquette, Kent D., et al., "Electron cyclotron resonance plasma etching using downstream magnetic confinement," J. Vac. Sci. Technol. B 10(6), Nov./Dec. 1992, © 1992 American Vacuum Society, pp. 2725-2728.

Lai, C., et al., "Magnetically confined inductively coupled plasma etching reactor," J. Vac. Sci. Technol. A 13(4), Jul./Aug. 1995, © 1995 American Vacuum Society, pp. 2086-2092.

* cited by examiner

*Primary Examiner* — Keath T Chen
(74) *Attorney, Agent, or Firm* — Alan Taboada; Moser IP Law Group

(57) ABSTRACT

A method and apparatus for confining a plasma are provided herein. In one embodiment, an apparatus for confining a plasma includes a substrate support and a magnetic field forming device for forming a magnetic field proximate a boundary between a first region disposed at least above the substrate support, where a plasma is to be formed, and a second region, where the plasma is to be selectively restricted. The magnetic field has b-field components perpendicular to a direction of desired plasma confinement that selectively restrict movement of charged species of the plasma from the first region to the second region dependent upon the process conditions used to form the plasma.

22 Claims, 6 Drawing Sheets

MAGNETIC CONFINEMENT OF A PLASMA

BACKGROUND OF THE INVENTION

1. Field of the Invention

Embodiments of the present invention generally relate to plasma-assisted processing of substrates, and more particularly, to magnetic confinement of a plasma in plasma-assisted substrate processing chamber.

2. Description of the Related Art

Plasma-assisted processing is a technique commonly used, for example, in the manufacture of semiconductor devices and integrated circuits. Such processing generally includes introducing a process gas into a chamber having a substrate, such as a semiconductor wafer, disposed therein and applying sufficient energy to the process gas to form a plasma over the substrate. The plasma contains dissociated and ionized components as well as neutral components that operate to assist the process being performed on the substrate (such as deposition, etching, and the like). Although the constituents of the plasma are beneficial for assisting or carrying out the process on the substrate, it is often undesirable for the plasma constituents to come into contact with other components within the process chamber, such as the substrate support, sidewalls, or lid of the chamber. As such, it is often desirable to try to contain or limit the plasma to a region directly over the substrate being processed.

This problem has been conventionally addressed by the use of mechanisms for physically confining the plasma in the desired area. For example, certain process chambers may contain baffles that physically constrain the plasma within a desired area. However, these baffles transfer the problem from one of the plasma contamination or attack of the process chamber to plasma attack or contamination of the baffles themselves. As such, the baffles become a consumable material that may contribute to particulate defects on the substrate and further require periodic maintenance or replacement. In addition, physical confinement of the plasma using baffles restricts the ability to pump out plasma effluent from the chamber, thereby further degrading process performance and potentially leading to substandard process throughput and increased substrate defects.

Therefore, a need exists for an improved method and apparatus for confining a plasma in a process chamber.

SUMMARY OF THE INVENTION

A method and apparatus for confining a plasma are provided herein. In one embodiment, an apparatus for confining a plasma includes a substrate support and a magnetic field forming device for forming a magnetic field proximate a boundary between a first region disposed at least above the substrate support, where a plasma is to be formed, and a second region, where the plasma is to be selectively restricted. The magnetic field has b-field components perpendicular to a direction of desired plasma confinement that selectively restrict movement of charged species of the plasma from the first region to the second region dependent upon the process conditions used to form the plasma.

In another embodiment, an apparatus for confining a plasma includes a process chamber having a first region where a plasma is to be formed and a second region where the plasma is to be selectively restricted. A substrate support is disposed within the process chamber. A magnetic field forming device is provided for forming a magnetic field proximate a boundary between the first and second regions. The magnetic field is adapted to restrict movement of charged species of a plasma formed under a first set of process conditions between the first and second regions, while not restricting movement of charged species of a plasma formed under a second set of process conditions between the first and second regions.

In another aspect of the invention, a method for confining a plasma includes providing a process chamber having a first region where a plasma is to be formed and a second region from which the plasma is to be selectively restricted; and creating a magnetic field having b-field components perpendicular to a direction from the first region to the second region, and having a configuration selected to restrict movement of charged species of a plasma from the first region to the second region when the plasma is formed under a first set of process conditions, and not restricting movement of charged species of the plasma from the first region to the second region when the plasma is formed under a second set of process conditions. A first process may be performed using a plasma formed with the first set of process conditions, such that movement of charged species of the plasma is restricted. A second process may also be performed using a plasma formed with the second set of process conditions, such that movement of charged species of the plasma is not restricted.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images in the drawings are simplified for illustrative purposes and are not depicted to scale.

DETAILED DESCRIPTION

The present invention provides methods and apparatus for confining a plasma using a magnetic field. In addition, the present invention further contemplates providing a method and apparatus for process selective plasma confinement using a magnetic field. In one embodiment, the method and apparatus of the invention confines a plasma discharge by exposing the plasma periphery to a magnetic field with a component perpendicular to the direction of desired confinement. The strength, direction, and location of the field is selected such that it confines plasmas under a first subset of process conditions, and does not confine plasmas under a second subset of process conditions that differs from the first subset.

Figure 1:
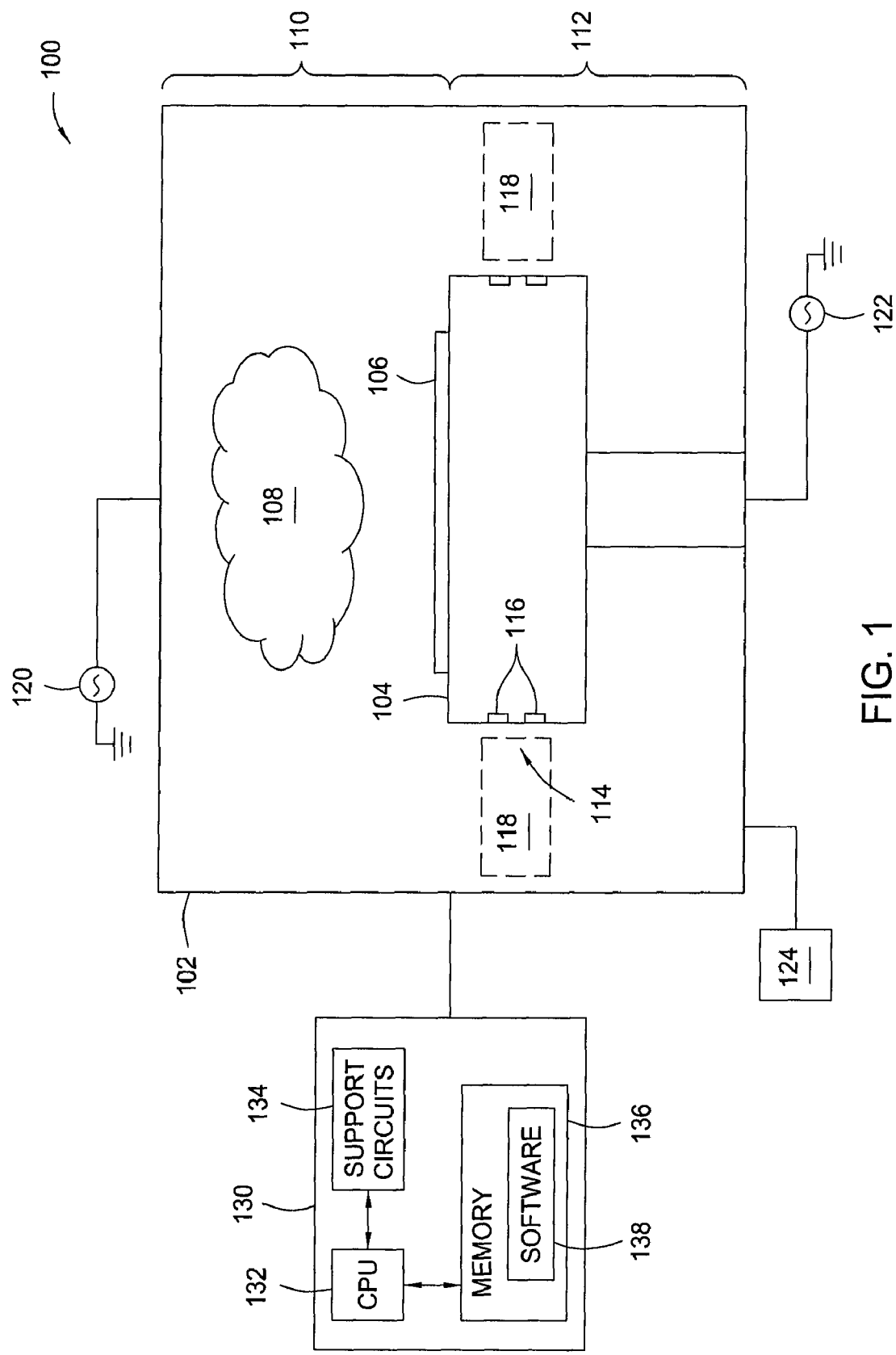
FIG. 1 is a schematic representation of a plasma-assisted process chamber in accordance with one embodiment of the present invention.

FIG. 1 schematically depicts a chamber 100 having a plasma confinement apparatus in accordance with the present invention. The chamber 100 may generally be any type of process chamber suitable for forming a plasma as modified by the teachings disclosed herein, including, but not limited to, capacitively-coupled process chambers, inductively-coupled process chambers, or the like, Examples of process chambers that may be adapted to benefit from the present invention include, but are not limited to, the eMax™, MXP®, and ENABLER™ process chambers, all available from Applied Materials, Inc. of Santa Clara, Calif. The eMax™ process chamber is described in U.S. Pat. No. 6,113,731, issued Sep. 5, 2000 to Shan, et al. The MXP® process chamber is described in U.S. Pat. No. 5,534,108, issued Jul. 9, 1669 to Qian, et al., and U.S. Pat. No. 5,674,321, issued Oct. 7, 1997 to Pu, et al. The ENABLER™ process chamber is described in U.S. Pat. No. 6,528,751, issued Mar. 4, 2003 to Hoffman, et al. Each of these above-mentioned patents are hereby incorporated by reference in their entireties.

In the embodiment depicted in FIG. 1, the chamber 100 includes a body 102 having a substrate support 104 disposed therein for supporting a substrate 106 thereon. The substrate support 104 may be a substrate support pedestal or portion thereof, such as an electrostatic chuck or the like. Within the body 102 of the chamber 100, there is a first region 110, where a plasma is to be formed (for example, where substrate processing occurs), and a second region 112, from which the plasma is to be selectively restricted. The first and second regions 110, 112 may be in any desired location within the chamber 100. In one embodiment, the first region 110 corresponds to an upper region disposed generally above the support surface of the substrate support 104 and the second region 112 corresponds to a lower region disposed generally below the substrate support surface of the substrate support 104 (e.g., generally below the substrate 106 during processing).

A first power source 120 is coupled to an electrode (not shown) proximate the first region 110 of the chamber 100, such as a lid of the chamber, a gas distribution showerhead, an inductive coil disposed near the chamber lid, or the like. The first power source 120 (sometimes referred to as a "top source," or a "source power") is generally capable of producing a radio-frequency (RF) signal at a power and frequency suitable to form a plasma from a process gas disposed in the first region 110 of the chamber 100. In one embodiment, the first power source 120 is generally capable of producing up to 5,000 Watts of radio-frequency (RF) power (i.e., source power) at a tunable frequency of above about 100 MHz. In one embodiment, the first power source 120 is generally capable of producing up to about 5,000 Watts of RF power at a tunable frequency of between about 100 kHz-200 MHz.

A second power source 122 may be coupled to an electrode disposed in or below the substrate support 104. The second power source 122 (sometimes referred to as a "bias source") is generally capable of producing up to about 5,000 W RF power (i.e., cathode bias power) at a tunable frequency of between about 50 kHz-13.6 MHz. Optionally, the second power source 122 may be a source of DC or pulsed DC power. Alternatively, the second power source 122 may comprise a dual-frequency RF power source (or two RF power sources), in which case the first power source 120 is optional. It is contemplated that the first power source 120 and the second power source 122 may be capable of producing more or less power and at greater or lesser frequencies.

Support systems 124 are also coupled to the process chamber 100. The support systems 124 include components used to execute and monitor pre-determined processes in the process chamber 100 (e.g., plasma-assisted etching, depositing, annealing, cleaning, and the like). Such components generally include various sub-systems (e.g., gas panel(s), gas distribution conduits, vacuum and exhaust sub-systems, and the like) and devices (e.g., additional power supplies, process control instruments, and the like) of the process chamber 100. These components are well known to those skilled in the art and are omitted from the drawings for clarity.

A magnetic field forming device 114 is provided for forming a magnetic field along a boundary between the first and second regions 110, 112 suitable for selectively at least partially confining, or restricting, movement of components of the plasma 108 between the first and second regions 110, 112 during processing. Magnetic confinement reduces the charge particle mobility of a plasma by exposing the charged particles to a magnetic field perpendicular to their velocity. This generates a force on the charged particle equal to:

$$\vec{F} = q(\vec{v} \times \vec{B}) \quad (1)$$

where F is the force exerted, q is the charge on the particle, v is the particle velocity, and B is the magnetic field strength. Since the direction of the force is perpendicular to the velocity of the charged particle, the net effect is a reduction in charged particle mobility perpendicular to the magnetic field direction. Therefore, by designing magnetic fields such that they are perpendicular to the flow of charged particles to a region of the process chamber where plasma is not desired (e.g., the second region 112 of the chamber 100), the reduction in mobility results in some level of plasma confinement between the region upstream from and downstream from the magnetic field.

In one embodiment, the magnetic field forming device 114 may form a magnetic field that either partially or completely surrounds the substrate support 104. The magnetic field forming device 114 may also form a magnetic field that either partially or completely fills a region 118 disposed between a portion of the side substrate support 104 and the chamber body 102. The magnetic field provided by the magnetic field forming device 114 may be disposed predominantly within the second region 112 of the chamber 100. In one embodiment, the magnetic field provided by the magnetic field forming device 114 may further be disposed predominantly below a support surface of the substrate support 104. The magnetic field forming device 114 may be disposed within or without the process chamber 100 and may be integrated into various chamber components or be a separate apparatus. In the embodiment depicted in FIG. 1, the magnetic field forming device 114 is disposed within the process chamber 100 and within the substrate support 104.

In the embodiment depicted in FIG. 1, the magnetic field forming device 114 comprises a plurality of magnets 116. The magnets 116 may be permanent magnets, electromagnets, or the like, or combinations thereof. In the embodiment depicted in FIG. 1, two magnets 116 are shown. It is contemplated that more than two magnets 116 may be utilized. The magnets 116 may be directly adjacent each other or may be spaced apart. When spaced apart, the distance between the magnets 116 may be determined based upon the desired configuration of the magnetic field (e.g., strength, geometry, and the like). In one embodiment, the magnets 116 are spaced between about 0.25-0.50 inches apart. In one embodiment, the magnets 116 are spaced about 0.25 inches apart. The polarity of the plurality of magnets 116 may be oriented in the same direction or may be alternated.

To reduce interference with processing of a substrate, the magnetic field provided by the magnetic field forming device 114 may be disposed predominantly along a periphery of the plasma, i.e., along the boundary between the first and second regions 110, 112 of the chamber. Accordingly, the magnets 116 or the magnetic field forming device 114 may be arranged such the magnetic field provided by the magnets 116 or the magnetic field forming device 114 is disposed predominantly within the second region 112 of the chamber 100 (for example, predominantly below a support surface of the substrate support 104). In one embodiment, an upper surface of the magnets 116 is disposed between about 0-4 inches below the support surface of the substrate support 104. In one embodiment, an upper surface of the magnets 116 is disposed about 4 inches below the support surface of the substrate support 104.

Optionally, one or more permanent magnets or electromagnets (not shown) may further be disposed about the chamber to facilitate control of characteristics of the plasma during processing (e.g., to control plasma formation, density, ionization, dissociation, sheath characteristics, and the like). The magnetic fields created by such magnets may be primarily disposed in the first region 110 of the chamber and may be controlled independent of the magnetic field formed by the magnetic field forming device 114. Examples of chambers having magnets for controlling the plasma during processing include the above-mentioned eMax™, MXP®, and ENABLER™ process chambers, available from Applied Materials, Inc.

A controller 130 is coupled to and controls the operation of the process chamber 100 (i.e., the support systems 124, power sources 120, 122, and the like). In some embodiments, the controller 130 may also control the magnetic field forming device 114 (such as when the magnetic field forming device 114 comprise electromagnets). The controller 130 may be a specific or general purpose computer generally containing a CPU 132, support circuits 134, and memory 136. A software routine 138 may reside in the memory 136 that, when executed, provides for operation and control of the process chamber 100 in accordance with the teachings disclosed herein.

Figure 2A:
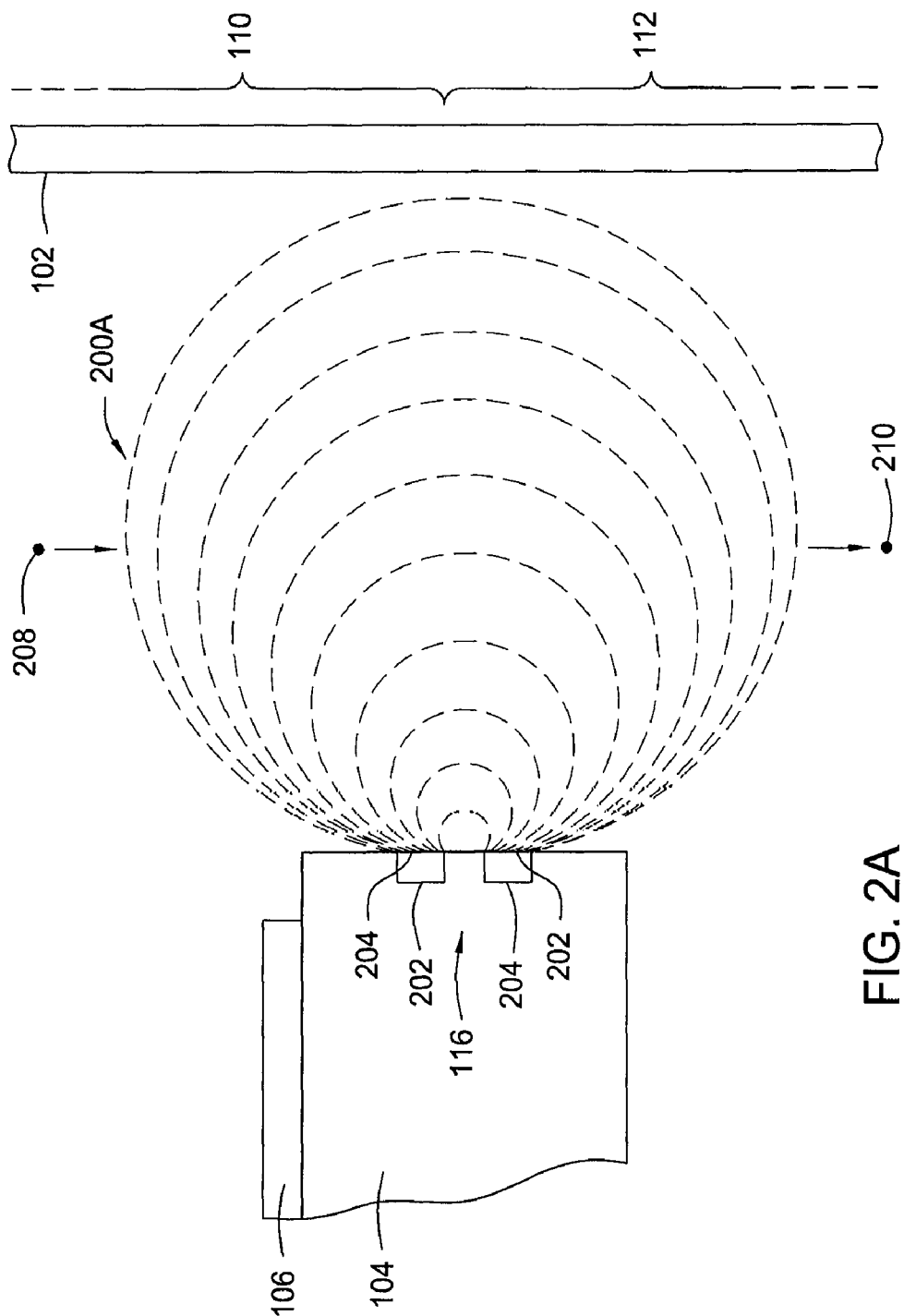
FIGS. 2A-B depict details of embodiments of the magnetic confinement apparatus depicted in FIG. 1.

FIG. 2A depicts a partial close-up of one embodiment of the magnetic field forming device 114 and the magnets 116 depicted in FIG. 1. In the embodiment depicted in FIG. 2A, the pair of magnets 116 are disposed about the periphery, i.e., the sides, of the substrate support 104 in a substantially parallel, spaced apart relation. The magnets 116 may completely circumscribe the substrate support 104 in one piece or multiple sections. Alternatively, one or more of the magnets 116 may comprise multiple sections that are disposed in a spaced apart relation along a circumferential path on the side of the substrate support 104.

Figure 2B:
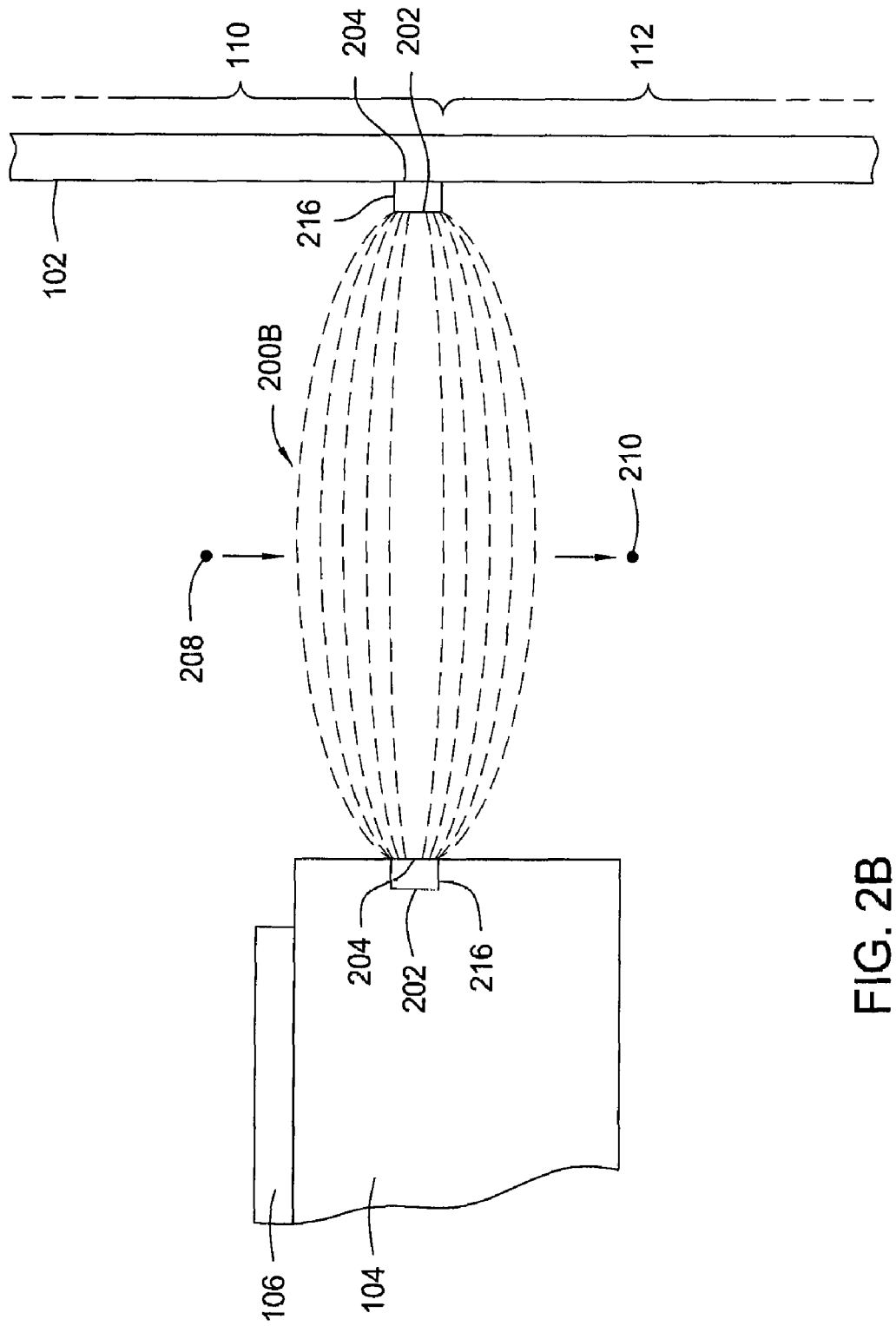

Another example of an embodiment of the magnetic field forming device 114 is depicted in the FIG. 2B. In this embodiment, a pair of magnets 216 are provided with one magnet 216 disposed proximate the substrate support 104 and one magnet 216 disposed proximate the chamber wall 102. It is contemplated that the magnets 216 may be formed in the substrate support 104 and/or the chamber wall 102 or may be disposed adjacent to the substrate support 104 and/or the chamber wall 102. In addition, with respect to the magnet 216 disposed proximate the chamber wall 102, the magnet 216 may be disposed inside or outside of the chamber. The magnets 216 may completely circumscribe the substrate support 104 and/or the chamber wall 102 in one piece or multiple sections. Alternatively, one or more of the magnets 216 may comprise multiple sections that are disposed in a spaced apart relation along a circumferential path on the side of the substrate support 104 and/or the wall 102.

The magnets 116, 216 depicted in FIGS. 2A-B each comprise a north pole 202 and a south pole 204. The north and south poles, 202 and 204, of each respective magnet 116, 216 may be inverted with respect to each other (i.e., any pole of each respective magnet 116, 216 is adjacent the opposite pole of an adjacent magnet). Alternatively, the north and south poles, 202 and 204, of each respective magnet 116, 216 may be similarly oriented. The magnets 116, 216 form a magnetic field, as illustratively shown by magnetic fields 200A and 200B. For clarity, only the portion of the magnetic fields 200A, 200R formed between the substrate support 104 and the body 102 of the chamber is shown. The magnetic fields 200A, 200B contain b-field components that are perpendicular to the velocity direction of a charged species 208 from the plasma 108 (shown in FIG. 1). Such a configuration restricts the ability of the charged species 208 to cross the magnetic field 200A, 200B into the second region 112 of the chamber, and, as such, confines the charged species 208 of the plasma within the first region 110.

The confinement, or restriction, of the charged species of the plasma does not affect neutral species, such as a neutral species 210, which may cross the magnetic field 200A, 200B into the second region 112 of the process chamber 100. As such, movement of neutral species may occur even in processes where confinement is strongly desired, such as during processes that utilize highly polymerizing chemistries—where confinement or restriction of polymer generation and deposition advantageously minimizes the need for cyclical chamber cleaning and increases the time between cleaning cycles.

Accordingly, although providing plasma confinement during some processes is beneficial, there are also processes where plasma confinement is not desired. For example, such as during chamber cleaning steps, where a polymer removal chemistry is used to return the chamber to a pristine state. During such processes, it is advantageous to allow the plasma to fill the entire chamber, for example, to allow the cleaning chemistry to fill the entire chamber to facilitate removal of any polymer that may have built up away from the processing region (e.g., in the second region 112 of the process chamber 100 shown in FIG. 1).

Depending upon process parameters that affect the plasma (such as source power, bias power, source frequency, bias frequency, process gas selection, chamber pressure, chamber process volume, and the like) and/or process parameters that affect the magnetic field (such as magnet strength, field direction, location, geometry, number of magnets, and the like), the amount, or level, of confinement of the charged species of the plasma within the first region 110 may be controlled.

For example, one method to measure the level of magnetic field confinement is to measure the ion flux from the plasma 108 to the body 102 in the first region 110 and the second region 112 of the process chamber 100 (as shown in FIG. 1) and calculating a ratio between the upper ion flux to the lower ion flux, referred to herein as an ion flux ratio. The greater the ion flux ratio, the greater the flux of the plasma constituents in the first region 110 as compared to the second region 112, which indicates a restriction of the charged species of the plasma within the first region 110. As the ion flux ratio approaches one, that indicates that the ion flux in the first region 110 is equal to that measured in the second region 112, which indicates no confinement of the charged species of the plasma within the first region 110.

Figure 3:
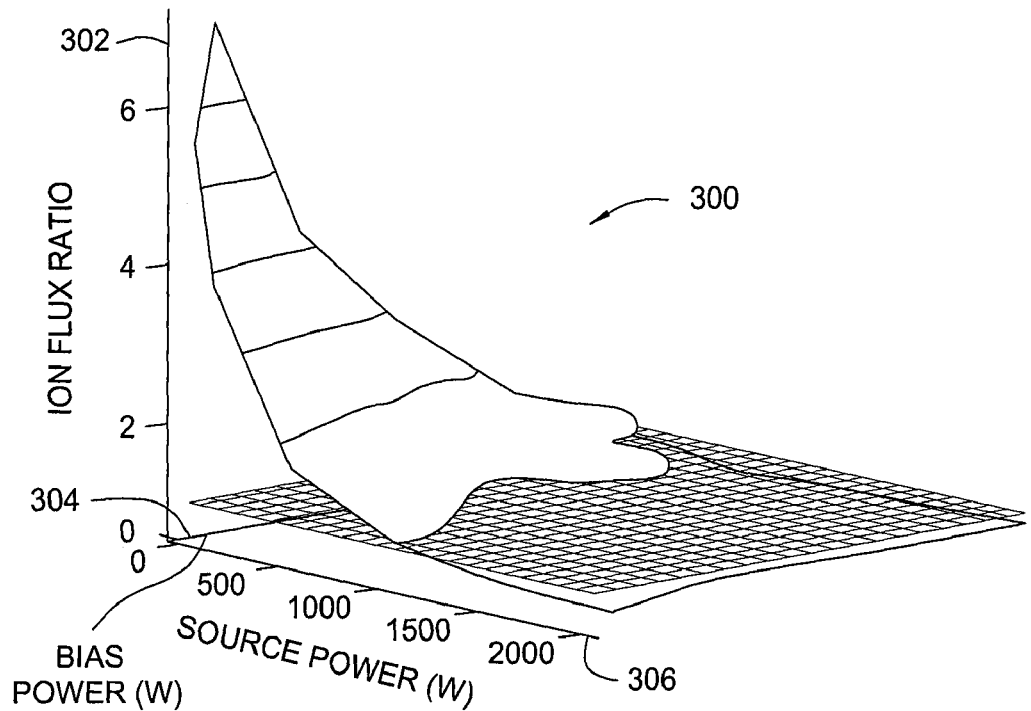
FIG. 3 is a graph of a plasma ion flux ratio with respect to bias power and source power.

FIG. 3 depicts an illustrative graph of the ion flux ratio (axis 302) with respect to a bias power (axis 304) and a source power (axis 306) in a plasma-assisted process chamber. Data for the graph was obtained in a capacitively coupled process chamber having a top (source) electrode coupled to a 60 MHz RF signal and a bottom (bias) electrode coupled to a 13.56 MHz RF signal at varying power levels. As discussed above, the greater the ion flux ratio, the more the plasma is confined to the first region of the chamber.

Figure 4:
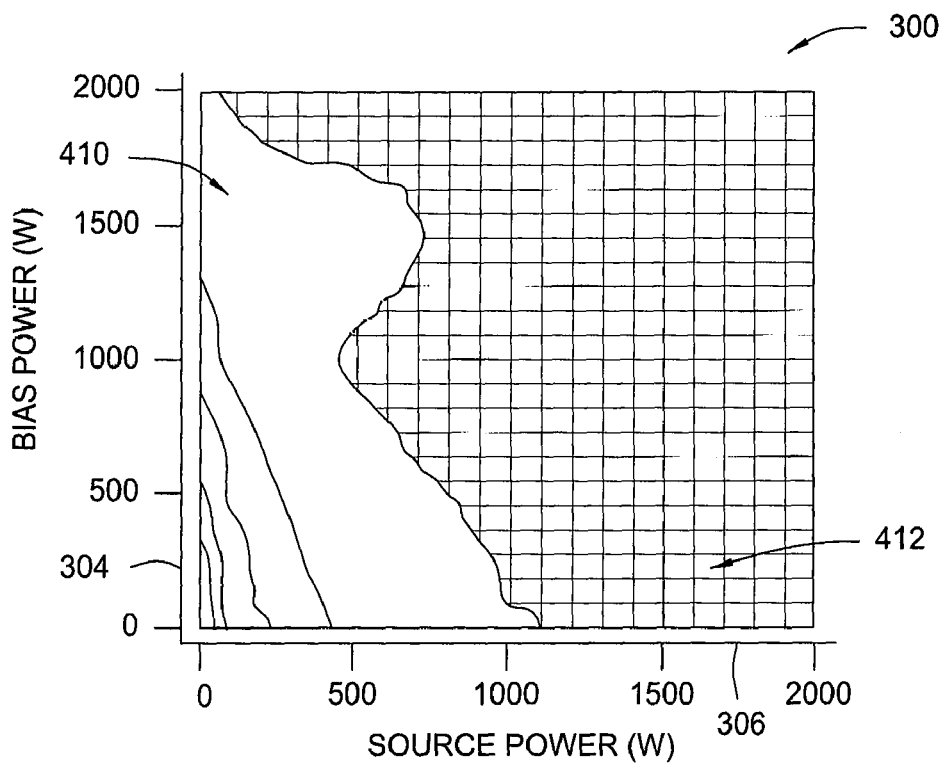
FIG. 4 depicts a graph of a process space with respect to bias power and source power derived from the graph of FIG. 3.

FIG. 4 depicts a top view of the graph of FIG. 3 showing the ion flux ratio graph 300 with respect to bias power (axis 304) and source power (axis 306). As can be seen in the graph of FIG. 4, a region 410 exists where the ion flux ratio is greater than one, which indicates varying levels of plasma confinement within the first region of the chamber. A second region 412 shows where no confinement of the plasma exists. As such, the graph 300 shown in FIG. 4 is a process map that reveals the process space (with respect to top and bottom RF power) for obtaining selective plasma confinement. Therefore, by controlling the bias power and/or the source power applied during various processes, magnetic confinement of the plasma can be similarly controlled to advantageously obtain or circumvent magnetic confinement as desired for various plasma processes.

Similar process maps may be created with respect to other process parameters that affect the plasma and/or the magnetic field. Alternatively or in combination, a three-dimensional process map may be constructed by the above approach performed with the magnetic field at varying strengths to extend the process window to include varying magnetic field strength in addition to the plasma-affective process parameters. In addition, other plasma parameters, such as process density, sheath voltage, electron temperature, process chemistry, and the like, can all be impacted by the volume of the plasma, which may be controlled by the plasma confinement mechanism disclosed herein. Accordingly, these parameters may also be mapped to determine process conditions desired for a particular process to further advantageously widen the process window for a plasma process chamber having the inventive plasma confinement apparatus.

Figure 5:
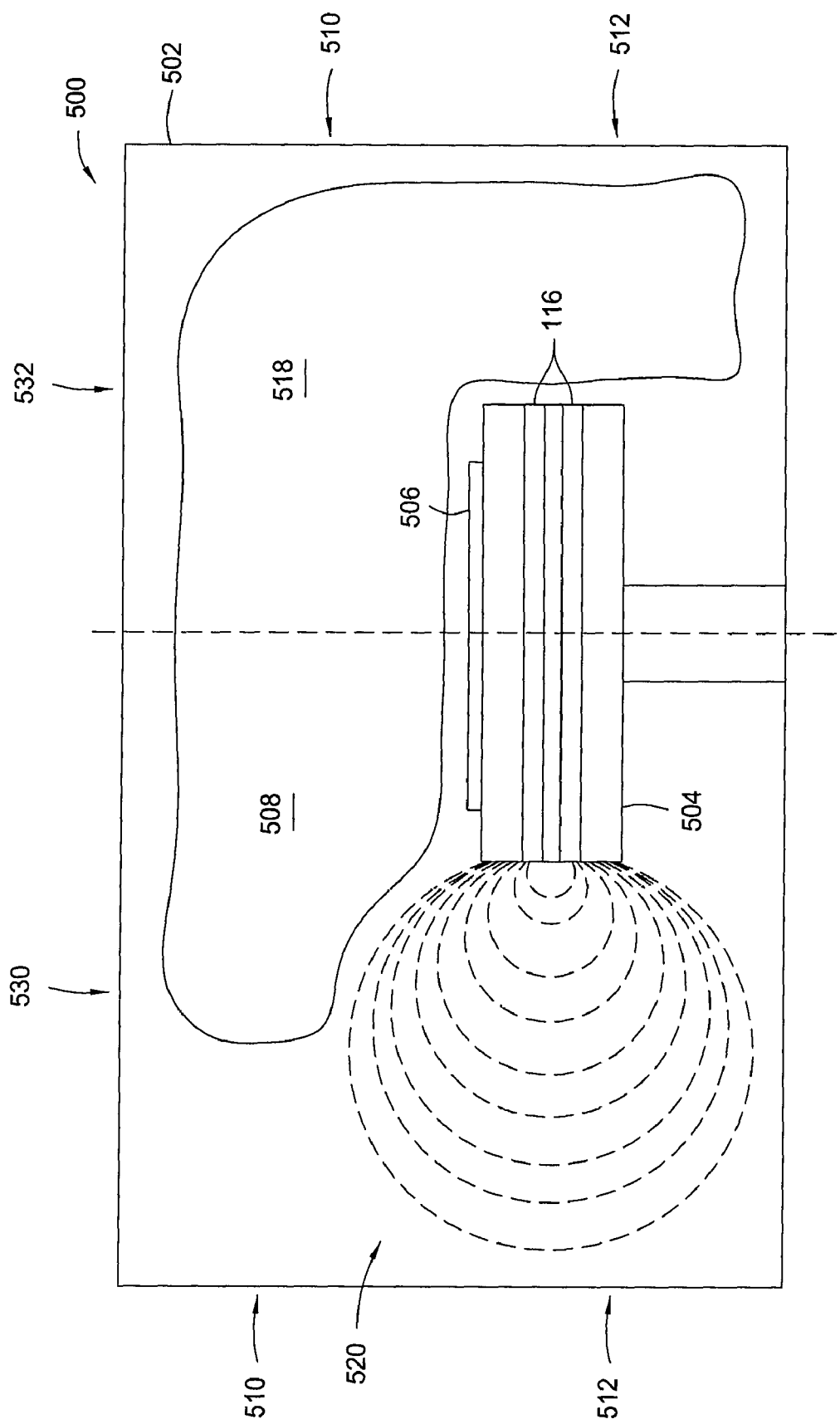
FIG. 5 depicts a graphical representation of a process chamber having a process selective magnetic confinement apparatus in accordance with embodiments to the present invention.

FIG. 5 depicts an illustrative side-by-side view of two processes being performed in a process chamber 500 similar to the process chamber 100 described. A first side 530 of the chamber 500 illustratively depicts a process running under conditions such that a plasma 508 formed within the chamber 500, is confined to a first region 510 of the chamber 500 by a magnetic field 520. A second side 532 of the chamber 500 illustratively depicts a plasma 518 formed under conditions sufficient to substantially fill the chamber 500 (i.e., the plasma is present in both the first region 510 and a second region 512 of the chamber 500).

Parameters for the two processes may be controlled as desired to obtain the selective plasma confinement depicted in FIG. 5. For example, using the data from FIGS. 3 and 4, if plasma confinement is desired in a process, the bias and/or source power may be selected to fall within region 410 of FIG. 4. Alternatively, if plasma confinement is not desired in a process, the bias and/or source power may be selected to fall within region 412 of FIG. 4.

In another example, substrate processing typically occurs at a top source power between about 0 W-1000 W, and a bias power between about 500 W-5000 W. Plasma confinement is generally desired during such substrate processing to improve process performance. However, chamber cleaning processes typically occur at a source power of greater than about 2000 W and a bias power of between about 0 W-100 W. As discussed above, plasma confinement is generally not desired during chamber cleaning processes. Accordingly, using a process map such as that depicted in FIG. 4, the source and bias power may be selectively controlled to operate each respective process with the desired level of plasma confinement.

Figure 6:
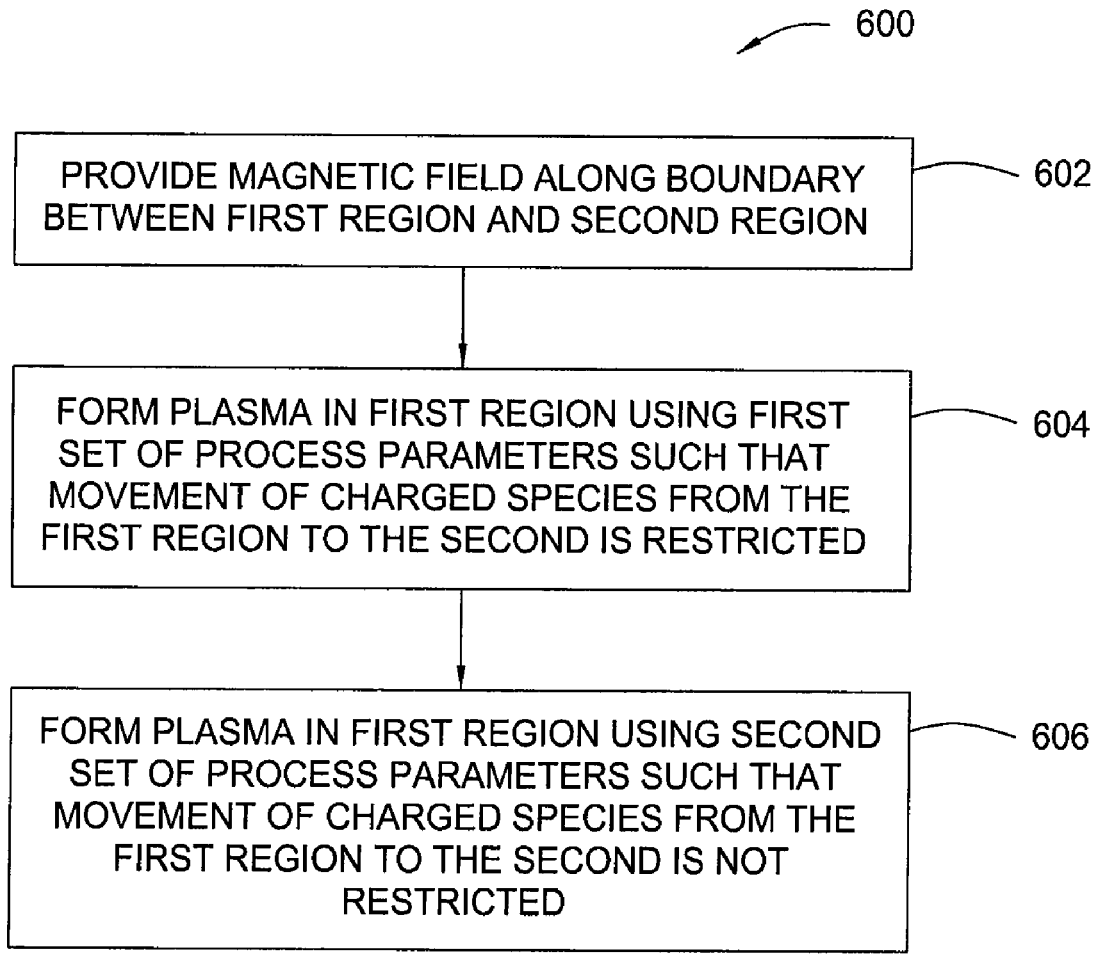
FIG. 6 depicts one embodiment of a method for process selective magnetic plasma confinement.

FIG. 6 depicts one embodiment of a method 600 for performing process selective magnetic field plasma confinement. In one embodiment, the method 600 begins at step 602, where a magnetic field is provided along a boundary between a first region, where a plasma is to be formed, and a second region, where the plasma is to be selectively restricted. In one embodiment, the magnetic field is provided around a periphery of a substrate support. The strength, direction, and/or location of the magnetic field may be selected to create b-field components that are perpendicular to the direction of desired confinement (e.g., from the first region to the second region).

Next, at step 604, a plasma may be formed in a first region of the chamber using a first set of process parameters, such that movement of charged species of the plasma from the first region to the second region is restricted. In one embodiment, the charged species are confined to an upper region of the chamber. In one embodiment, the first set of process parameters includes at least one of source power, bias power, source frequency, bias frequency, process gas selection, chamber pressure, and chamber process volume. In one embodiment, the first set of process parameters includes at least one of source power and bias power.

Next, at step 606, a second plasma may be formed in the first region of the chamber using a second set of process parameters, such that movement of charged species of the plasma from the first region to the second region is not restricted. In one embodiment, the charged species are not confined to the upper region of the chamber. In one embodiment, the second set of process parameters includes at least one of source power, bias power, source frequency, bias frequency, process gas selection, chamber pressure, and chamber process volume. In one embodiment, the second set of process parameters includes at least one of source power and bias power.

Thus, embodiments of methods and apparatus for process selective plasma confinement using a magnetic field have been provided. In one embodiment, the method and apparatus of the invention confines a plasma discharge by exposing the plasma periphery to a magnetic field with a component perpendicular to the direction of desired confinement. The strength, direction, and location of the field is selected such that it confines plasmas under a first set of process conditions, and does not confine plasmas under a second set of process conditions that differs from the first set.

While the foregoing is directed to embodiments of the present invention, other and further embodiments of the invention may be devised without departing from the basic scope thereof, and the scope thereof is determined by the claims that follow.

The invention claimed is:

1. Apparatus for confining a plasma, comprising:
a process chamber having a substrate support disposed therein;
a magnetic field forming device for forming a magnetic field proximate a boundary between a first region disposed at least above the substrate support, where a plasma is to be formed, and a second region, where the plasma is to be selectively restricted; and
a controller adapted to control the apparatus such that charged species of a plasma formed using a first set of process conditions is restricted by the magnetic field from moving from the first region into the second region and charged species of a plasma formed using a second set of process conditions can move through the magnetic field from the first region to the second region.

2. The apparatus of claim 1, wherein the magnetic field forming device comprises one or more electromagnets.

3. The apparatus of claim 1, wherein the magnetic field forming device comprises one or more permanent magnets.

4. The apparatus of claim 3, wherein the magnetic field forming device comprises a plurality of permanent magnets.

5. The apparatus of claim 1, wherein the magnetic field forming device is disposed in or coupled to the substrate support.

6. The apparatus of claim 1, wherein the magnetic field forming device forms a magnetic field proximate a side of the substrate support and predominantly below a support surface of the substrate support.

7. The apparatus of claim 1, wherein the first region comprises an upper region of the process chamber disposed above the support surface of the substrate support, and wherein the second region comprises a lower region of the process chamber disposed below the support surface of the substrate support.

8. The apparatus of claim 1, wherein the magnetic field forming device comprises a plurality of magnets, the plurality of magnets disposed along at least a first circumferential path along a side of the substrate support and a second circumferential path along a side of a sidewall of the process chamber.

9. The apparatus of claim 1, wherein the magnetic field forming device comprises a plurality of magnets, the plurality of magnets disposed along at least two spaced-apart circumferential paths along a side of the substrate support.

10. The apparatus of claim 9, wherein the magnets are permanent magnets.

11. The apparatus of claim 9, wherein the circumferential paths are spaced apart between 0.25 and 0.5 inches.

12. The apparatus of claim 9, wherein an uppermost portion of the magnets is disposed up to 4 inches below the support surface of the substrate support.

13. The apparatus of claim 1, wherein the magnetic field forming device is adapted to form a magnetic field in a region disposed between a side of the substrate support and a wall of the process chamber.

14. Apparatus for confining a magnetic field, comprising:
a process chamber having a first region where a plasma is to be formed and a second region where the plasma is to be selectively restricted;
a substrate support disposed within the process chamber;
a magnetic field forming device for forming a magnetic field proximate a boundary between the first and second regions; and
a controller adapted to control the apparatus such that charged species of a plasma formed using a first set of process conditions is restricted by the magnetic field from moving from the first region into the second region and charged species of a plasma formed using a second set of process conditions can move through the magnetic field from the first region to the second region.

15. The apparatus of claim 14, wherein the magnetic field forming device comprises a plurality of magnets.

16. The apparatus of claim 15, wherein the plurality of magnets are coupled to or disposed within the substrate support.

17. The apparatus of claim 16, wherein the plurality of magnets are disposed along at least two spaced-apart circumferential paths along a side of the substrate support.

18. The apparatus of claim 17, wherein the plurality of magnets comprise permanent magnets.

19. The apparatus of claim 14, wherein the plurality of magnets further comprise at least one magnet disposed proximate the substrate support and at least one magnet disposed proximate a sidewall of the process chamber.

20. The apparatus of claim 14, wherein the first region comprises an upper region disposed above the support surface of the substrate support, and wherein the second region comprises a lower region disposed below the support surface of the substrate support.

21. The apparatus of claim 14, further comprising:
one or more magnets disposed about the process chamber and configured to control characteristics of the plasma.

22. Apparatus for confining a plasma, comprising:
a process chamber having a substrate support disposed therein;
one or more permanent magnets configured to form a magnetic field proximate a boundary between a first region disposed at least above the substrate support, where a plasma is to be formed, and a second region, where the plasma is to be selectively restricted; and
a controller adapted to control the apparatus such that charged species of a plasma formed in the first region using a first set of process conditions is restricted by the magnetic field from moving from the first region into the second region and charged species of a plasma formed in the first region using a second set of process conditions can move through the magnetic field from the first region to the second region.

* * * * *